(12) United States Patent
Amano et al.

(10) Patent No.: US 6,537,513 B1
(45) Date of Patent: Mar. 25, 2003

(54) SEMICONDUCTOR SUBSTRATE AND METHOD FOR MAKING THE SAME

(75) Inventors: Hiroshi Amano, Aichi (JP); Tetsuya Takeuchi, Kanagawa (JP); Isamu Akasaki, Aichi (JP)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/562,978

(22) Filed: Apr. 27, 2000

(30) Foreign Application Priority Data

Nov. 7, 1997 (JP) .............................. 9-306215
Nov. 2, 1998 (WO) ..................................... US98/23277

(51) Int. Cl.$^7$ .......................... C01B 33/26; C30B 25/02
(52) U.S. Cl. ...................................... 423/328.2; 117/84
(58) Field of Search .......................... 117/84; 423/328.2

(56) References Cited

U.S. PATENT DOCUMENTS 6,265,287 B1 * 7/2001 Tsujimura et al. .......... 438/478

FOREIGN PATENT DOCUMENTS

| EP | 0497350 A1 | 8/1992 | ........... C30B/25/02 |
| EP | 0779666 A2 | 6/1997 | ........... H01L/33/00 |
| JP | 09199759 | 7/1997 | ........... H01L/33/00 |
| WO | WO96/22408 | 7/1996 | ........... C30B/23/02 |

OTHER PUBLICATIONS

Takahashi, Naoyuki et al., "Growth of GaN on GaAs(111)B by Metalorganic Hydrogen Chloride VPE", Jpn. J. Appl. Phys., vol. 36, 1997, pp. L1133–1135.
Uchida, Kenji et al., "Epitaxial Growth of GaN Layers with Double–Buffer Layers", Proceedings of the Second Intl. Conf. on Nitride Semiconductors, (ICNS'97), pp. 214–215.
Nakamura, Shuji et al., "InGaN/GaN/ALGaN–Based Laser Diodes with Modulation–Doped Strained–Layer Superlattices Grown on an Epitaxially Laterally Overgrown GaN Substrate", Appl. Phys. Letters, vol. 36, 1998, pp. 211–213.
Usui, Akira et al., "Thick GaN Epitaxial Growth with Low Dislocation Density by Hydride Vapor Phase Epitaxy", Jpn. J. Appl. Phys., vol. 36, 1997, pp. L899–902.

* cited by examiner

Primary Examiner—Felisa Hiteshew
(74) Attorney, Agent, or Firm—Patent Law Group LLP; Brian D. Ogonowsky

(57) ABSTRACT

A substrate for fabricating semiconductor devices based on Group III semiconductors and the method for making the same. A substrate according to the present invention includes a base substrate, a first buffer layer, and a first single crystal layer. The first buffer layer includes a Group III material deposited on the base substrate at a temperature below that at which the Group III material crystallizes. The Group III material is crystallized by heating the buffer layer to a temperature above that at which the Group III material crystallizes to form a single crystal after the Group III material has been deposited. The first single crystal layer includes a Group III–V semiconducting material deposited on the first buffer layer at a temperature above that at which the Group III semiconducting material crystallizes. In one embodiment of the present invention, a second buffer layer and a second single crystal layer are deposited on the first single crystal layer. The second buffer layer includes a Group III material deposited on the first single crystal layer at a temperature below that at which the Group III material crystallizes. The Group III material is then crystallized by heating the buffer layer to a temperature above that at which the Group III material crystallizes to form a single crystal. The second single crystal layer includes a Group III–V semiconducting material deposited on the second buffer layer at a temperature above that at which the Group III semiconducting material crystallizes.

9 Claims, 2 Drawing Sheets

SEMICONDUCTOR SUBSTRATE AND METHOD FOR MAKING THE SAME

REFERENCE TO RELATED APPLICATIONS

The present application claims foreign priority from Japanese application No.: 09.306215, filed on Nov. 7, 1997, and from PCT application No.: U.S. Ser. No. 98/23277, filed on Nov. 2, 1998, published in English as WO 99/25030.

FIELD OF THE INVENTION

The present invention relates to the fabrication of Group III–V semiconductor devices and more particularly, to a method for generating a Group III–V semiconductor substrate having a substantially lower defect density than currently available substrates.

BACKGROUND OF THE INVENTION

Laser diodes that use semiconductor material based on GaN, or other Group III–V semiconductors that emit in the blue and violet regions of the spectrum hold the promise of substantially improving the amount of information that can be stored on an optical disk. To improve the cost effectiveness of such devices, the light-emitting and light-receiving elements together with various unipolar/bipolar transistors, diodes, and passive elements need to be integrated on the same substrate. These additional types of elements are also fabricated using Group III–V semiconductors.

One problem in constructing such integrated circuits is the inability to provide a single crystal Group III–V substrate of sufficient size to accommodate all of the desired devices needed for the integrated circuit. In general, the devices are constructed on a single crystal Group III–V substrate. At present, Group III–V semiconductor single crystal substrates are limited to diameters of several millimeters to one centimeter. These substrates are too small for practical applications. Hence, systems based on the growth of the Group III–V single crystals on a different type of substrate such as sapphire or SiC have been developed. Unfortunately, the lattice constants of these substrates are significantly different from the lattice constants of the Group III–V semiconductor materials. This difference leads to defects when a Group III semiconductor layer is grown on the substrate. Typically $10^7$ to $10^{11}$ crystal defects are generated per $cm^2$. These defects limit the performance of the fabricated elements.

Various techniques for reducing these defects have been proposed. For example, A. Usui, H. Sunakawa, A. Sakai, and Yamaguchi, 36 JPN. J. APPL. PHYS., L899 (1997) teach a method for reducing threading dislocations in Group III semiconductors. In this conventional technique, a Group III nitride semiconductor buffer layer is deposited on a non-Group III–V substrate such as sapphire. Next, strips of a dielectric thin film of $SiO_2$ are formed on the surface of the buffer layer. A Group III nitride single crystal layer is then grown. The second Group III nitride layer is seeded from the region of the buffer layer between the dielectric strips and grows out over the strips. It is observed experimentally that the material that grows out over the strips has a significantly lower density of defects. Typically, dislocation densities from around $10^5$ to $10^7$ $cm^{-2}$ are obtained over the dielectric thin film. While this method substantially reduces the density of dislocations, there is still a need to provide further reductions in the dislocation density.

In addition, this method requires that the substrate and buffer layer be removed from the reactor used to grow the Group III nitride layers at least once to deposit the dielectric film strips. The handling problems associated with the removal of the substrate from the reactor, depositing the dielectric strips, and then returning the substrate to the reactor lead to mechanical problems in the buffer layer. As a result, the buffer layer tends to peel off of the underlying substrate.

Broadly, it is the object of the present invention to provide an improved Group III–V single crystal thin film on which to construct Group III–V semiconductor devices.

It is a further object of the present invention to provide a Group III–V single crystal thin film having a lower density of defects than that obtained by growing a Group III–V semiconducting layer over dielectric strips.

It is a still further object of the present invention to provide a method for growing a Group III–V single crystal thin film that does not require that the substrate be removed from the reactor during the growth process.

These and other objects of the present invention will become apparent to those skilled in the art from the following detailed description of the invention and the accompanying drawings.

SUMMARY OF THE INVENTION

The present invention is a substrate for fabricating semiconductor devices based on Group III semiconductors and the method for making the same. A substrate according to the present invention includes a base substrate, a first buffer layer, and a first single crystal layer. The first buffer layer includes a Group III material deposited on the base substrate at a temperature below that at which the Group III material crystallizes. The Group III material is crystallized by heating the buffer layer to a temperature above that at which the Group III material crystallizes to form a single crystal after the Group III material has been deposited. The first single crystal layer includes a Group III–V semiconducting material deposited on the first buffer layer at a temperature above that at which the Group III semiconducting material crystallizes. In one embodiment of the present invention, a second buffer layer and a second single crystal layer are deposited on the first single crystal layer. The second buffer layer includes a Group III material deposited on the first single crystal layer at a temperature below that at which the Group III material crystallizes. The Group III material is then crystallized by heating the buffer layer to a temperature above that at which the Group III material crystallizes to form a single crystal. The second single crystal layer includes a Group III–V semiconducting material deposited on the second buffer layer at a temperature above that at which the Group III semiconducting material crystallizes.

DETAILED DESCRIPTION OF THE INVENTION

For the purposes of the present discussion, a "low temperature" refers to a temperature that is less than the temperature at which the relevant Group III semiconductor material will grow as a single crystal. Typically this temperature is 100° C. below that at which the relevant Group III semiconductor material forms a single crystal utilizing the relevant deposition method.

The present invention is based on a structure consisting of a pair of single crystal films that are formed on the surface of a base substrate. The base substrate may be a Group III material or a material such as sapphire. The first Group III semiconductor thin film is generated by depositing a first Group III material thin film at a low temperature and heating this film to a temperature above the crystallization temperature. The heating step will be referred to as activated crystallization in the following discussion. The second single crystal film is deposited in the conventional manner, i.e., at a temperature at which a single crystal thin film is obtained without activated crystallization. Experimental observations confirm that the dislocation density in the second single crystal thin film is less than that of the surface on which the pair of layers was constructed. This process can be repeated until the desired level of defects is obtained. Since each new pair of films results in a lowered dislocation density, the method of the present invention can be used to provide a substrate having much lower dislocation densities than substrates that are now available. Further, the device does not need to be removed from the reactor between deposition steps; hence, the mechanical problems discussed above are avoided.

Figure 1:
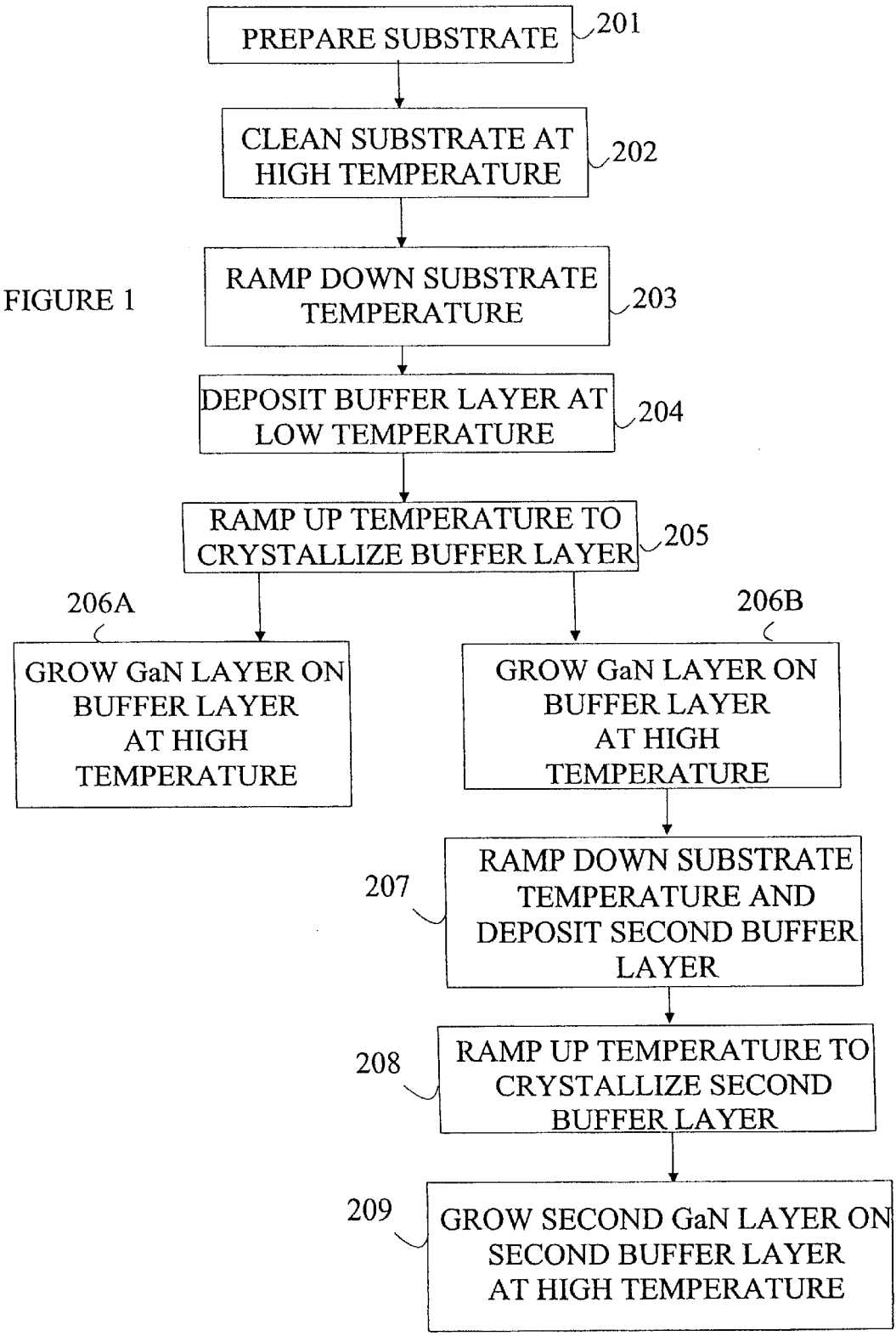
FIG. 1 is a flow chart for the method of the present invention.
Figure 2:
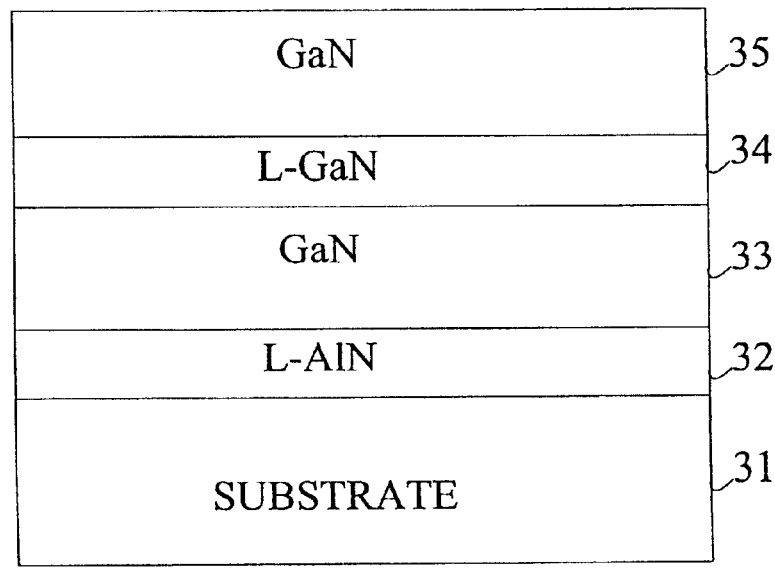
FIG. 2 is a cross-sectional view of a substrate generated by the method of the present invention.

Having provided the above overview of the method of the present invention, the manner in which the method of the present invention is utilized to provide a low dislocation surface on which to fabricate Group III semiconductor devices will now be explained in more detail. Refer to FIGS. 1 and 2. FIG. 1 is a flow chart for the method of the present invention. FIG. 2 is a cross-sectional view of a substrate generated by the method of the present invention. Referring to FIGS. 1 and 2, the sapphire substrate 31 is washed in an organic solvent such as acetone or methanol, and placed in the heating unit of a metallorganic vapor phase epitaxy system as shown at 201. The atmosphere is switched from nitrogen to hydrogen. The substrate temperature is then increased to 1,150° C. and allowed to stand for about 10 minutes. This results in the surface of the substrate being cleaned as shown at 202. Next, the substrate temperature is reduced to 500° C. as shown at 203.

A low temperature AlN buffer layer 32 is then deposited at 400° C. as shown at 204. The buffer layer is deposited from a flow of 3 slm (standard liters/minute) of ammonia and trimethyl aluminum (TMAl):$(CH_3)_3Al$ supplied at 30 $\mu$mol/min. A deposition time of about 5 minutes results in a first low temperature buffer layer 32 having a thickness of 30 nm. This low temperature layer is then crystallized as shown at 205. The crystallization is performed by increasing the substrate temperature to 1,050° C. The temperature is ramped to this value over a period of 30 minutes. As the temperature increases, buffer layer 32 is gradually crystallized starting from the surface near the substrate. The process is continued until the entire film crystallizes to become a single crystal film.

A GaN film having substantially fewer defects than a GaN film grown directly on the substrate can be deposited as shown at 206A. In the example being discussed here, the film is deposited by introducing trimethyl gallium (TMGa) :$(CH_3)_3Ga$ into the reaction chamber while maintaining the substrate at 1,050° C. This precursor is supplied at 30 $\mu$mol/min. into the reactor to form a single-crystal GaN thin film 33 on buffer layer 32. The reaction time is determined by the desired thickness of film 33. Compared to directly growing film 33 on the sapphire substrate 31, the various qualities of single-crystal GaN thin film 33 are markedly improved. This substrate can be used in the fabrication of blue LEDs (light-emitting diodes) and green LEDs, violet LDs (laser diodes), or microwave FETs (field-effect transistors) by growing the various layers that form those devices on the exposed surface of layer 33.

However, crystal defects such as threading dislocations, called nanopipes, at densities of about $10^7$ to $10^{11}$ cm$^{-2}$ are still present in single-crystal GaN thin film 33. This density of dislocations is sufficient to degrade device characteristics. Accordingly, the preferred embodiment of the present invention utilizes a procedure in which additional pairs of layers are grown.

Specifically, after the first single-crystal GaN thin film 33 has grown to about 1 $\mu$m on the first buffer layer 32, the supply of TMGa is terminated as shown at 206B and the substrate temperature is reduced to 500° C. The supply of TMGa is then restarted, and a thin film 34 containing at least Ga and nitrogen is deposited as shown at 207. This second buffer layer 34 deposited at a low temperature is an amorphous semiconductor in which polycrystals also exist in the deposited state. The amorphous material and the polycrystals are converted to a single crystal by increasing the substrate temperature to 1,050° C. after turning off the gas flow as shown at 208. Most of the nanopipes in the first single-crystal GaN thin film 33 terminate at the crystallized second buffer layer 34. Hence, when the next GaN thin film is grown as a single crystal at 1,050° C. as shown at 209, the nanopipe density is nearly zero. Furthermore, there are fewer crystal defects in this layer compared to layer 33. Experimental observations provide an estimate of less than $10^3$ defects per cm$^2$.

Although the layer 35 described above has a relatively low defect density, further reductions in defect densities are desirable. Such further reductions may be obtained by repeating the two-layer growth process.

The above described embodiments of the present invention utilized specific buffer and Group III single crystal layers. However, other materials may be utilized for each of these layers. For example, the buffer layer may include Ga as well as Al or combinations thereof. In addition, it is to be understood that a Group III nitride semiconductor includes any material containing at least GaN, AlN, InN, BN, AlInN, GaInN, AlGaN, BAlN, BInN, BGaN, or BAlGaInN.

Furthermore, each thin film formed in FIG. 2 can be formed from a different Group III–V semiconductor material. The process in which the Group III–V semiconductor single-crystal thin film is grown on top of a low temperature buffer layer is the modular process that may be repeated as many times as needed to provide the desired defect density. It should be noted further that the process parameters could be adjusted for the differences in the Group III–V semiconductor material and any dimensional differences during the modular process.

The fabrication method described above for the various layers utilized metallorganic vapor phase epitaxy. However, similar results have been obtained with molecular beam epitaxy, halide vapor phase epitaxy (HVPE), and laser abrasion epitaxy. The same crystal defect density was confirmed even in the exposed substrate formed by implementing the unit process on the thick film GaN substrates fabricated by HVPE. Accordingly, the present invention provides an effective method for producing large Group III–V substrates.

The above-described embodiments of the present invention utilized sapphire substrates in which the layers were grown on the (0001) face. However, the method of the present invention has also been shown to provide similar advantages for layers grown on other faces of sapphire and different types of substrates. Similar results were obtained with the (10–12) face, (11–20) face, and (10–10) of sapphire substrates as well as substrates constructed from 6H—SiC, 4H—SiC, 3C—SiC, spinel ($MgAl_2O_4$), Si, and $LiGaO_2$.

Figure 3:
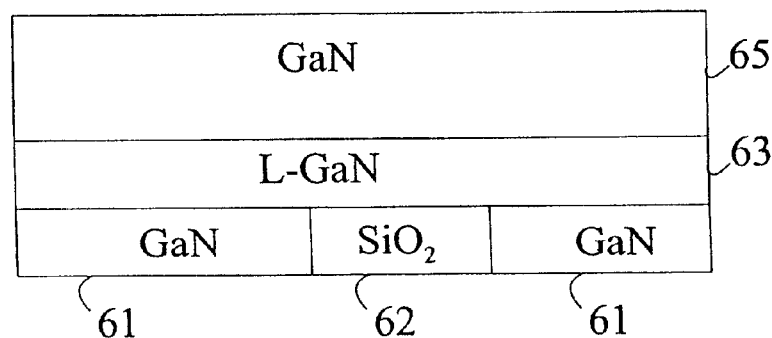
FIG. 3 is a cross-sectional view of a substrate generated by the method of the present invention in which the substrate includes a dielectric island.

It should also be noted that the top surface of layer 33 on which the second buffer layer 34 is deposited as discussed above may include less than the entire Group III–V semiconductor single crystal. Hence, this layer can be used to seed a layer grown over a dielectric strip or high melting point metal as described above. A cross-sectional view of such an embodiment of the present invention is shown in FIG. 3 at 60. A surface 61 having a dielectric layer 62 deposited therein is used as the surface on which a low temperature buffer layer and a single crystal Group III nitride semiconductor film are deposited as described above. The crystal defect density of the second single-crystal thin film 65 is much lower than the crystal defect density of the Group III nitride semiconductor single crystal 61.

The low temperature film 63 is deposited over regions 61 and 62 and then heated to crystallize the film as described above. The crystallization occurs from close to the Group III nitride semiconductor single crystal 61 and crystallizes upward as the temperature increases after deposition at the low temperature. The crystallization also proceeds upwards from strip 62. Layer 65 comprising the high temperature Group III single crystal film is then deposited on the buffer layer.

The advantages of the present invention are independent of the thickness of the buffer deposited at the low temperature over a wide range of thickness. Similar results are obtained with thicknesses ranging from 0.2 nm to greater than 800 nm. In the preferred embodiment of the present invention, the buffer layer deposited at a low temperature has a thickness from 2 nm to 500 nm.

Similarly, the advantages of the present invention are obtained over a wide range of deposition temperatures from room temperature to 850° C. In the preferred embodiment of the present invention, the low temperature buffer layer is deposited at a temperature between 200° C. and 700° C. When the temperature during deposition is too low, the percentage of amorphous semiconductor is high compared to the percentage of polycrystalline semiconductor, and the resultant layer has a high degree of irregularity. In addition, the time needed to crystallize the layer is increased when the buffer layer is deposited at too low a temperature. Finally, control of small temperature variations is better at substrate temperatures above 200° C.

In the preferred embodiment of the present invention, the activated crystallization of the buffer layer deposited at a low temperature is accelerated by irradiating the buffer layer with radiation from a $CO_2$ gas laser in addition to increasing the temperature of the substrate by heating the substrate holder. Other forms of heating the low temperature deposited layer may also be used. For example, other types of lasers or electron beam irradiation may be used to provide the heating for the activation crystallization of the low temperature buffer layer.

When the substrate implemented by the present invention is used to form various devices, substantial improvements in these devices are obtained compared to the same devices fabricated on a conventional substrate. For example, the substrate of the present invention was used to fabricate an AlGaN/GaN modulation doped field effect transistor with a 0.25 $\mu$m gate length. The FET had an operating frequency above 100 GHz. When the substrate of the present invention was used to fabricate a ridge waveguide laser diode, continuous wave operation was achieved and the laser diode had significantly lower internal losses. When the substrate of the present invention was used to fabricate pn junction photodetection diode, a decrease in the dark current and an increase in the amplification were recorded relative to a similar device constructed on a conventional substrate. When the substrate of the present invention was used to fabricate an AlN/GaN semiconductor multilayer mirror, no cracks were observed and the mirror exhibited high reflectivity at a wavelength of 400 nm. Finally, when the substrate of the present invention was used to construct an AlN/GaN sub-band transition device, the transition between the first excitation level and the ground state at a wavelength from 1.5 $\mu$m to 20 $\mu$m based on the difference in the well width was clearly observed. When a prior art substrate was used, cracks could not be prevented, and the device performed poorly.

It will be apparent from the preceding discussion that the present invention provides a substrate having reduced defects. Furthermore, the mechanical defects that arise from the need to remove the substrate from the reactor between deposition steps are also eliminated. In addition, adjusting the number of layer pairs deposited on the substrate can control the density of defects. This provides a means for trading processing cost against substrate quality. In an application in which higher defect levels can be tolerated, fewer layers are needed, and hence, the cost is reduced.

Various modifications to the present invention will become apparent to those skilled in the art from the foregoing description and accompanying drawings. Accordingly, the present invention is to be limited solely by the scope of the following claims.

What is claimed is:

1. A substrate for fabricating semiconductor devices based on Group III–V semiconductors, said substrate comprising:
    a base substrate:
    a first buffer layer, said buffer layer comprising a Group III–V semiconducting material deposited on said base substrate at a temperature below that at which said Group III–V semiconducting material crystallizes, said Group III–V semiconducting material being crystallized by heating said buffer layer to a temperature above that at which said Group III–V semiconducting material crystallizes to form a single crystal after said Group III–V semiconducting material has been deposited;
    a first single crystal layer comprising a Group III–V semiconducting material deposited on said first buffer layer at a temperature above that at which said Group III–V semiconducting material crystallizes, said first single crystal layer having a thickness of at least 300 nm;
    a second buffer layer, said second buffer layer comprising a Group III–V semiconducting material deposited on said first single crystal layer at a temperature below that at which said Group III–V semiconducting material crystallizes, said Group III–V semiconducting material being crystallized by heating said buffer layer to a temperature above that at which said Group III–V semiconducting material crystallizes to form a single crystal after said Group III–V semiconducting material has been deposited; and
    a second single crystal layer comprising a Group III–V semiconducting material deposited on said second buffer layer at a temperature above that at which said Group III–V semiconducting material crystallizes.

2. The substrate of claim 1, wherein said base substrate comprises a material chosen from the group consisting of sapphire, 6H—SiC, 4H—SiC, 3C—SiC, spinel ($MgAl_2O_4$), Si, and $LiGaO_2$.

3. The substrate of claim 1, wherein said first buffer layer comprises Ga or Al.

4. The substrate of claim 1, wherein said first buffer layer has a thickness between 0.2 nm and 800 nm.

5. A method for fabricating semiconductor devices based on Group III–V semiconductors, said method comprising:

depositing a first buffer layer comprising a Group III–V semiconducting material on a base substrate at a temperature below that at which said Group III–V semiconducting material crystallizes;

crystallizing said Group III–V semiconducting material by heating said buffer layer to a temperature above that at which said Group III–V semiconducting material crystallizes to form a single crystal;

depositing a first single crystal layer comprising a Group III–V semiconducting material on said first buffer layer at a temperature above that at which said Group III–V semiconducting material crystallizes to a thickness of at least 300 nm;

depositing a second buffer layer comprising a Group III–V semiconducting material on said first single crystal layer at a temperature below that at which said Group III–V semiconducting material crystallizes;

crystallizing said second buffer layer by heating said buffer layer to a temperature above that at which said Group III–V semiconducting material crystallizes to form a single crystal; and depositing a second single crystal layer comprising a Group III–V semiconducting material on said second buffer layer at a temperature above that at which said Group III–V semiconducting material crystallizes.

6. The method of claim 5, wherein said base substrate comprises a material chosen from the group consisting of sapphire, 6H—SiC, 4H—SiC, 3C—SiC, spinel ($MgAl_2O_4$), Si, and $LiGaO_2$.

7. The method of claim 5, wherein said first buffer layer comprises Ga or Al.

8. The method of claim 5, wherein said first buffer layer has a thickness between 0.2 nm and 800 nm.

9. The method of claim 5, wherein said Group III–V semiconducting material is deposited by a method chosen from the Group consisting of a metallorganic vapor phase epitaxy, a molecular beam epitaxy, a halide vapor phase epitaxy (HVPE), and a laser abrasion epitaxy.

* * * * *